United States Patent [19]

Sunada

[11] Patent Number: 5,721,157

[45] Date of Patent: Feb. 24, 1998

[54] METHOD FOR MANUFACTURING A SEMICONDUCTOR DEVICE HAVING INTERCONNECTION LAYERS

[75] Inventor: Takeshi Sunada, Shimonoseki, Japan

[73] Assignee: Kabushiki Kaisha Toshiba, Kawasaki, Japan

[21] Appl. No.: 642,858

[22] Filed: May 6, 1996

[30] Foreign Application Priority Data

May 11, 1995 [JP] Japan ..................... 7-113268

[51] Int. Cl.$^6$ ............................. H01L 21/283
[52] U.S. Cl. .................. 437/195; 437/228; 437/978; 437/924
[58] Field of Search .................. 437/189, 195, 437/228, 978, 924

[56] References Cited

U.S. PATENT DOCUMENTS

| | | | |
|---|---|---|---|
| 4,966,870 | 10/1990 | Barber et al. | 437/228 |
| 5,244,837 | 9/1993 | Dennison | 437/195 |
| 5,258,328 | 11/1993 | Sunada et al. | 437/195 |
| 5,371,047 | 12/1994 | Greco et al. | 437/238 |
| 5,451,543 | 9/1995 | Woo et al. | 437/195 |

*Primary Examiner*—T. N. Quach

*Attorney, Agent, or Firm*—Finnegan, Henderson, Farabow, Garrett & Dunner, L.L.P.

[57] ABSTRACT

A method for manufacturing a semiconductor device comprises, after sequentially forming first and second insulating films over a semiconductor substrate, forming a lower interconnection layer formation groove by a lithography technique and anisotropic etching technique in the second insulating film and first insulating film. Then a lower interconnection layer material is formed over a whole surface of a resultant structure and it is removed, by a chemical/mechanical polishing technique, in a way to leave a portion as a buried interconnection layer in the lower interconnection layer formation groove. Then first and second insulating interlayers are subsequently formed over a whole surface of a resultant structure and an upper interconnection layer formation groove is formed in the second insulating interlayer. Then a via hole is formed in the first insulating interlayer at an area connecting an upper interconnection layer to a lower interconnection layer. The formation of the via hole is achieved by setting an etching rate of the first insulating interlayer to be over ten times that of the second insulating film and second insulating interlayer. After the formation of the via hole, an upper interconnection layer is formed as a buried layer in the upper interconnection formation groove and via hole and it is electrically connected to the lower interconnection layer.

2 Claims, 3 Drawing Sheets 5,721,157

METHOD FOR MANUFACTURING A SEMICONDUCTOR DEVICE HAVING INTERCONNECTION LAYERS

BACKGROUND OF THE INVENTION

1. Field of the Invention

The present invention relates to a method for manufacturing a semiconductor device and, in particular, a method for connecting an upper interconnection layer and lower interconnection layer via a buried interconnection layer in a multi-level layered structure over a semiconductor substrate.

2. Description of the Related Art

FIGS. 1A to 1D show the conventional process for forming a multi-level layered structure in the manufacture of a semiconductor integrated circuit (IC) device with a lower interconnection layer and upper interconnection layer not electrically connected to each other and FIGS. 1A to 1C and 1E to 1G, the conventional process for forming a multi-level layered structure with a lower interconnection layer and upper interconnection layer electrically connected to each other.

FIG. 1A shows the step of, subsequent to forming a first insulating film 41 on a semiconductor substrate 40 by a CVD (chemical vapor deposition) method for instance, forming a groove 50 in the first insulating layer with the use of a lithography technique and anisotropic etching (for example, an RIE: a reactive ion etching) technique.

Then subsequent to forming a lower interconnection layer material on the whole surface of the substrate 40, the lower interconnection layer material on the first insulating film 41 is removed by a CMP (chemical/mechanical polishing) method to leave a lower interconnection layer 42 as a buried layer in the groove 50.

After forming an insulating interlayer 43 over the whole surface of the substrate 40 as shown in FIG. 1B, a groove 45 for an upper interconnection layer is formed in the insulating interlayer 43 by the lithography technique and RIE technique as shown in FIG. 1C. In FIG. 1C, reference numeral 44 shows a resist pattern used as an etching mask when the groove 45 is formed.

After the resist pattern 44 is removed, an upper interconnection layer material is formed on the whole surface of the insulating interlayer 43 and then the upper interconnection layer material on the first insulating film 43 is removed by the CMP method to leave an upper interconnection layer 48 as a buried layer in the groove 45 as shown in FIG. 1D.

In this way, a multi-level layered structure can be formed such that the lower interconnection layer 42 and upper interconnection layer 48 are not electrically connected to each other.

On the other hand, the prior art process for forming such upper and lower interconnection layers 42 and 48 over a common semiconductor substrate 40 in an electrically connected way is as shown in FIGS. 1A to 1C and 1E to 1G.

In this case, the steps 1A to 1C are the same as set out above and any further explanation is, therefore, omitted.

After removing the resist pattern 44 as shown in FIG. 1C, a resist pattern 46 as an etching mask is formed on the insulating interlayer 43 as shown in FIG. 1E and a via hole 47 is formed in the insulating interlayer 43, by the lithography technique and RIE technique, as shown in FIG. 1F to provide a zone for connecting together an upper and a lower interconnection layer.

After removing the resist pattern 46, an inner interconnection layer 48 material is formed on the insulating interlayer 43 and then the upper interconnection layer material on the insulating interlayer 43 is removed by the CMP method to leave an upper interconnection layer 48 as a buried layer in the groove 45 and via the hole 47 as shown in FIG. 1G.

It is considered here that, in the above-mentioned process, a misalignment caused when the groove 45 for the upper interconnection layer is formed through the resist patterning as shown in FIG. 1C and that caused when the via hole 47 is formed through the resist pattern as shown in FIG. 1F are both on the same line.

In this case, the first insulating layer 41 is partially overetched at the side area of the lower interconnection layer 42 during the formation of the via hole 47 to provide a narrow groove 49. Since the sum of the two amounts of misalignment are of the order of 0.1 to 0.2 µm and such a groove 49 is very narrow, it is not possible to fully bury the upper interconnection layer 48 material in the narrow groove 49.

In the case where the narrow groove 49 is created due to the above-mentioned misalignment caused at a time of patterning, a contact area between the upper interconnection layer 48 and lower interconnection layer 42 is decreased at the via hole 47 so that the so-called via hole resistance is raised to adversely affect the operation speed of a device on an integrated circuit. This also causes a fall in reliability of the device, a decline in manufacturing yield, and so on.

If, in the case where the upper interconnection layer and lower interconnection layer are connected through a buried interconnection layer in the via hole in a multi-level interconnection structure having such a buried interconnection layer in a semiconductor device, the above-mentioned misalignments occur on the same line when a groove for the upper interconnection layer is formed through the resist patterning and when a via hole is formed through the resist patterning, and the prior art manufacturing method of a semiconductor device has encountered the problem with which, for example, a narrow groove 49 is formed in the first insulating film 41 at the side area of the lower interconnection layer 42 so that only a small contact area is left between the upper interconnection layer and the lower interconnection layer.

SUMMARY OF THE INVENTION

It is accordingly the object of the present invention to provide a method for manufacturing a semiconductor device, which can prevent a narrow groove from being created in an insulating film at a side area of a lower interconnection layer in connecting together an upper interconnection layer and lower interconnection layer via a buried interconnection layer in a multi-level layered structure over a semiconductor substrate and hence prevent a decrease in a contact area between the upper interconnection layer and the lower interconnection layer and achieve enhanced device reliability.

In order to achieve the object of the present invention, there is provided a method for manufacturing a semiconductor device comprising the steps of:

subsequent to sequentially forming first and second insulating films over a semiconductor substrate, forming a lower interconnection layer formation groove in the second and first insulating films by a lithography method and anisotropic etching technique;

after forming a lower interconnection layer material on a whole surface of a resultant structure, removing the lower interconnection layer material by a chemical/mechanical polishing method on the second insulating film to leave the lower interconnection layer material as a buried lower interconnection layer in the lower interconnection layer formation groove;

after sequentially forming first and second insulating interlayers on a whole surface of a resultant semiconductor structure, forming an upper interconnection layer formation groove by lithography technique and anisotropic etching technique in the second insulating interlayer;

forming a via hole in the first insulating interlayer by the lithography technique and anisotropic etching technique at an area connecting an upper interconnection layer to the lower interconnection layer, the formation of the via hole being effected, by the anisotropic etching technique, at an etching rate over 10 times those of the second insulating film and second insulating interlayer; and removing an upper interconnection layer material by the chemical/mechanical polishing method on the second insulating interlayer in a way to leave the upper interconnection layer material, as a buried upper interconnection layer, in the upper interconnection layer formation groove and via hole.

According to the method of the present invention, as set out above, it is possible to prevent a narrow groove from being created in the insulating film at a side area of the lower interconnection layer, or prevent a decrease in a contact area between the upper interconnection layer and the lower interconnection layer, when the upper and lower interconnection layers are connected together through the buried interconnection layer in the via hole in a multi-level layered structure over a semiconductor substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Figure 1A:
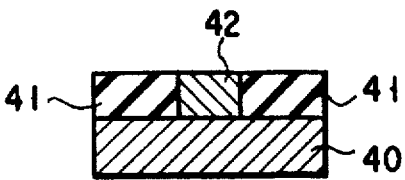
FIG. 1A is a cross-sectional view showing the step of manufacturing a conventional semiconductor device and, in particular, a semiconductor integrated circuit (IC)
Figure 1B:
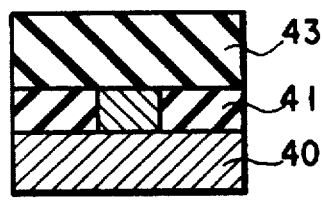
FIG. 1B is a cross-sectional view showing a manufacturing step following the step of FIG. 1A.
Figure 1C:
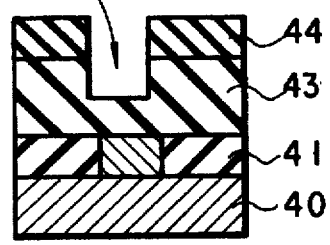
FIG. 1C is a cross-sectional view showing a manufacturing step following the step of FIG. 1B.
Figure 1E:
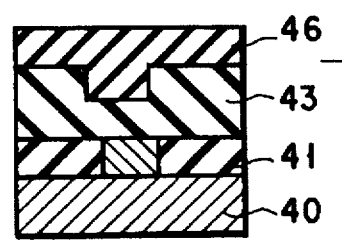
FIG. 1E is a cross-sectional view showing a manufacturing step following the step of FIG. 1C.
Figure 1F:
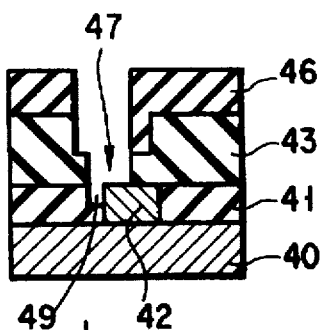
FIG. 1F is a cross-sectional view showing a manufacturing step following the step of FIG. 1E.
Figure 1D:
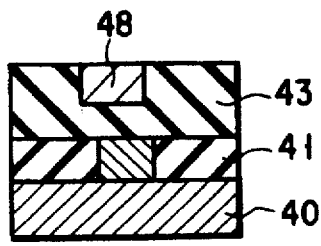
FIG. 1D is a cross-sectional view showing a manufacturing step following the step of FIG. 1C, a step of forming, in a multi-level layered structure over a substrate, an upper interconnection layer not electrically connected to a lower interconnection layer.
Figure 1G:
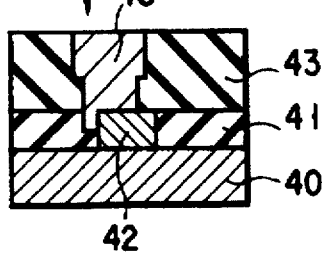
FIG. 1G is a cross-sectional view showing a manufacturing step following the step of FIG. 1F, a step of forming, in a multi-level layered structure over a substrate, an upper interconnection layer electrically connected to a lower interconnection layer.

The embodiments of the present invention will be explained below with reference to the accompanying drawings.

In a method of manufacturing a semiconductor device of the present invention, in particular, a semiconductor IC (integrated circuit) device, FIGS. 2A to 2D show the process of forming a multi-level interconnection structure over a substrate with a lower and an upper interconnection layer not electrically connected to each other and FIGS. 2A to 2C and 2E to 2G show the process of forming a multi-level interconnection structure over a substrate with a lower and an upper interconnection layer electrically connected to each other.

FIGS. 2A to 2D show the process for forming multi-level interconnection structure having a buried interconnection layer formed in an insulating film of the substrate.

First, a first insulating film 11 and second insulating film 12 are sequentially deposited, by a CVD method for instance, over a semiconductor substrate 10. Then a groove 13 for a lower interconnection layer is formed in the second and first insulating films 12 and 11 by the lithography technique and anisotropic etching (for example, RIE: reactive ion etching) technique.

Then a lower interconnection layer material (for example, a metal interconnection layer material) is deposited by a PVD (physical vapor deposition) method on the whole surface of the substrate 10 and melted in the groove 13.

The lower interconnection layer material on the second insulating film 12 is removed by the CMP method to leave a lower interconnection layer 14 as a buried inter-connection layer in the groove 13. That is, the lower interconnection layer material is polished with the second insulating film 12 used as a stopper material for CMP to be made flush with the surface of the second insulating layer 12.

By doing so, the thickness of the lower inter-connection layer 14 is made equal to the sum of the thickness of the second insulating film 12 and that of the first insulating film 11.

Figure 2A:
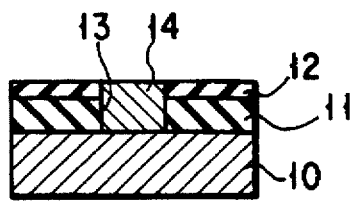
FIG. 2A is a cross-sectional view showing a step of manufacturing a semiconductor device according to the present invention, in particular, a semiconductor integrated circuit (IC)
Figure 2B:
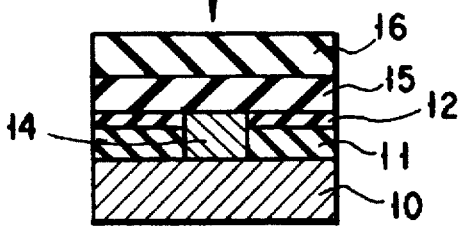
FIG. 2B is a cross-sectional view showing a manufacturing step following the step of FIG. 2A.

As shown in FIG. 2B, a first insulating interlayer 15 and second insulating layer 16 are sequentially formed over the whole surface of the substrate 10 to provide a layered structure. A groove 18 for an upper interconnection layer 48 is formed in the second insulating interlayer 16, as shown in FIG. 2C, with the use of the lithography technique and RIE technique.

Figure 2C:
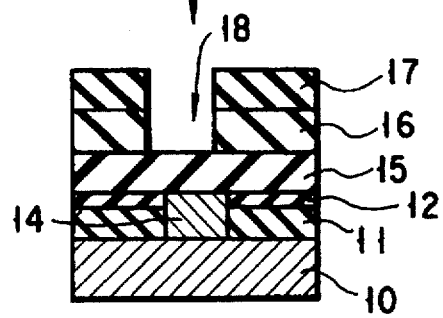
FIG. 2C is a cross-sectional view showing a manufacturing step following the step of FIG. 2B.

In FIG. 2C, reference numeral 17 shows a resist pattern serving as an etching mask in the formation of the groove for the upper interconnection layer.

Figures 2E, 2F:
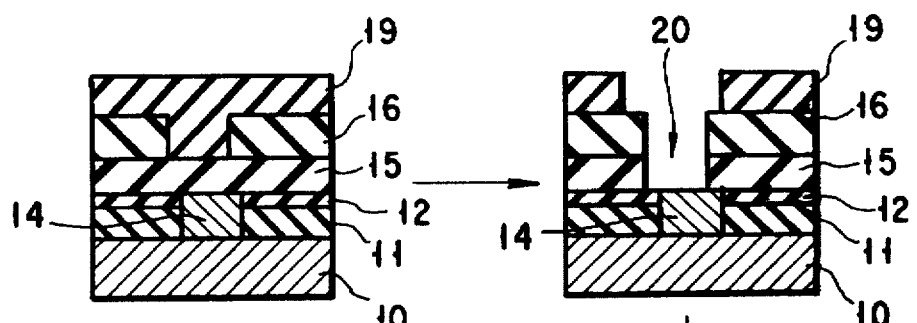
FIG. 2E is a cross-sectional view showing a manufacturing step following the step of FIG. 2C.
FIG. 2F is a cross-sectional view showing a manufacturing step following the step of FIG. 2E.
Figure 2D:
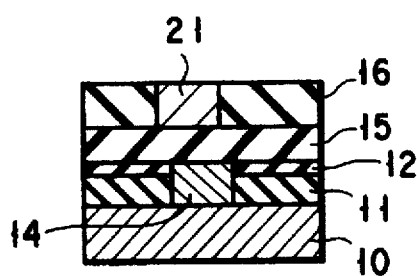
FIG. 2D is a cross-sectional view showing a manufacturing step following the step of FIG. 2C, a step of forming, in a multi-level layered structure over a substrate, an upper interconnection layer not electrically connected to a lower interconnection layer.
Figure 2G:
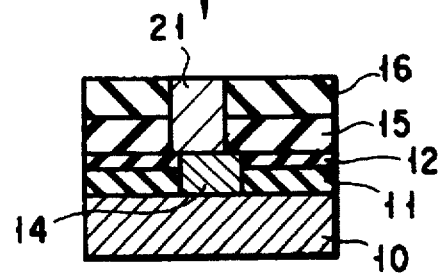
FIG. 2G is a cross-sectional view showing a manufacturing step following the step of FIG. 2F, a step of forming, in a multi-level layered structure over a substrate, an upper interconnection layer electrically connected to a lower interconnection layer.

After the removal of the resist pattern 17, as shown in FIG. 2D an upper interconnection layer material is formed over the whole surface of the second insulating interlayer 16 and the upper interconnection layer material on the second insulating film 16 is removed by the CMP (chemical/mechanical polishing) method to leave an upper interconnection layer 21 as a buried layer in the groove 18.

As set out above, in a multi-level interconnection structure over the substrate 10, the lower and upper interconnection layers 14 and 21 are so formed as to include the first insulating interlayer 15 therebetween with these layers 14 and 21 not electrically connected to each other.

The process for forming a multi-level interconnection structure with a lower interconnection layer 14 and upper interconnection layer 21 electrically connected to each other over a common semiconductor substrate 10 is shown in FIGS. 2A to 2C and 2E to 2G.

The process as shown in FIGS. 2A to 2C is substantially the same as set out above and an explanation thereof is omitted for brevity sake.

After the resist pattern 17 as shown in FIG. 2C has been removed, a resist pattern 19 serving as an etching mask as shown in FIG. 2E is formed on the second insulating interlayer 16 and a via hole 20 is formed in the first insulating interlayer 15, at an area connecting the upper interconnection layer and lower interconnection layer, as shown in FIG. 2F with the use of the lithography technique and RIE technique.

In this case, the rate of etching of the first insulating interlayer 15 by the RIE in the formation of the via hole can be set to be over 10 times (about 15 to 20 times in actual practice) that of the second insulating film 12 and second insulating interlayer 16 by using, for example, an $SiO_2$ film or one kind of a presently frequently used oxide film such as a TEOS (tetraethoxysilane) for the first insulating film 11 and first insulating interlayer 15 and, for example, an SiN film for the second insulating film 12 and second insulating interlayer 16.

Figure 3:
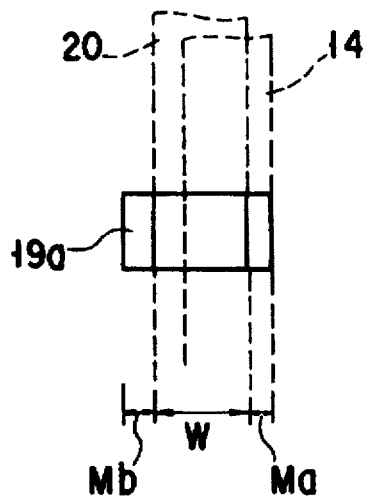
FIG. 3 is a plan view for explaining the setting of an opening diameter of a resist pattern in the step of forming a via hole.

As shown in FIG. 3, the diameter of an opening 19a (that is, the length of the interconnection groove in a direction intersecting with its longitudinal direction) in the resist pattern 19 is set to be a sum of an amount of misalignment Ma between a width W of the upper interconnection layer formation groove 18 and the opening diameter of the resist pattern for forming the upper interconnection layer formation groove and an amount of misalignment Mb between that of the upper interconnection layer formation groove 18 and the opening diameter of the resist pattern for forming the via hole.

FIG. 3 above shows the case where these amounts of misalignments Ma and Mb occur on the same line.

After the removal of the resist pattern 19, an upper interconnection layer 21 material, such as a metal interconnection layer material, is deposited by the PVD method on the second insulating interlayer 16 and in the groove 18 and via hole 20 and then it is melted in the upper interconnection groove 18 and via hole 20.

Then the upper interconnection layer material on the second insulating film 16 is so removed by the CMP method as to leave a buried upper interconnection layer 21. That is, the upper interconnection layer material is polished by the CMP method with the second insulating interlayer 16 used as a stopper material to be made flush with the surface of the second insulating interlayer 16.

In this way, the upper interconnection layer 21 buried in the groove 18 and via hole 20 is electrically connected to the lower interconnection layer 14.

It is possible to effect the deposition/melting of the lower interconnection layer 14 material by one step under high temperature or also to effect the deposition/melting of the upper interconnection layer 21 material by one step under high temperature.

Figure 4:
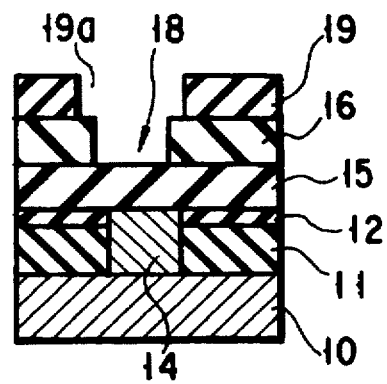
FIG. 4 is a cross-sectional view showing a step of manufacturing a semiconductor device, a step of forming an upper interconnection layer formation groove in an insulating interlayer with the opening diameter of the resist pattern of FIG. 3 set.

In the above-mentioned embodiment, since the etching rate of the first insulating interlayer 15 is set to be over 10 times (about 15 to 20 times in practice) that of the second insulating film 12 and second insulating interlayer 16 during the formation of a via hole by the RIE method, even if there occurs overetching of, for example, about 30% in the case where there occur, on the same line, the misalignments (Mb and Ma), one occurring at the patterning step in the formation of the via hole 20 and one occurring at the patterning step in the formation of the groove 18, the second insulating film 12 serves as an etching stopper so that, as shown in FIG. 4, no narrow groove occurs at the side area of the lower interconnection layer 14 with a resultant high reliability of the interconnection structure obtained.

Further, since the opening diameter of the resist pattern for via hole formation covers the misalignment (Ma) occurring at the resist patterning time during the formation of the groove in the upper interconnection layer and misalignment (Mb) occurring at the resist patterning time during the formation of the via hole, the width of the upper interconnection layer 21 and opening diameter of the via hole 20 can be formed to have the same size. It is, therefore, possible to form the via hole 20 beneath the upper interconnection layer 21 in a self-aligned way.

It is thus possible to suppress, to a minimal extent (below the amount of misalignment Ma occurring at the resist patterning time for forming a groove for the upper interconnection layer), a decrease in the contact area between the upper interconnection layer 21 and the lower interconnection layer 14 in the via hole resulting from the misalignment at the resist patterning time.

In other words, the multi-level structure of the present invention can prevent the prior art problems, such as a rise in the via hole resistance resulting from a decrease at a contact area between the upper interconnection layer 21 and the lower interconnection layer 14, a resultant adverse effect on the operation speed of the device, a decline in a resultant device reliability, a fall in yield, and so on. Incidentally, the semiconductor device of the present invention can alleviate an adverse effect on the operation speed, which the prior art device has been encountered, and can achieve a nearly 2 to 5%-improved yield.

The process for forming a multi-level interconnection structure according to a second embodiment of the present invention will be explained below with reference to FIGS. 5 and 6.

Figure 5:
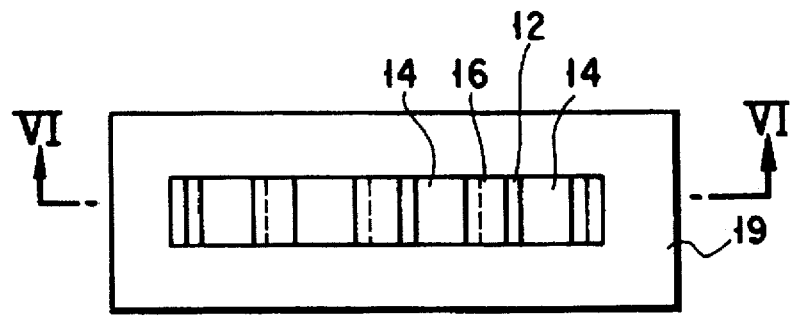
FIG. 5 is a plan view showing another embodiment of a semiconductor device according to the present embodiment.
Figure 6:
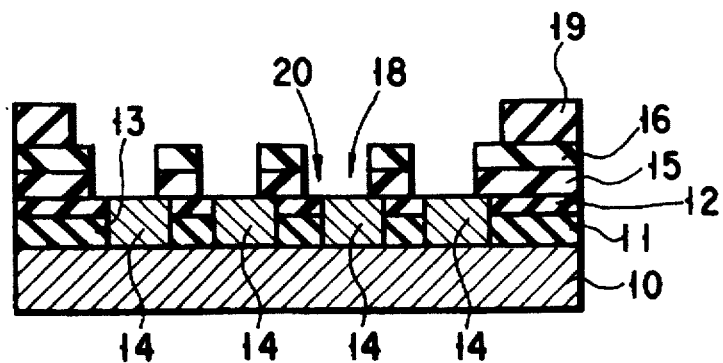
FIG. 6 is a cross-sectional view as taken along line VI—VI in FIG. 5.

FIGS. 5 and 6 show, as evident from their plan view and cross-sectional view as taken in an arrow direction of line VI—VI, the simultaneous formation of a plurality of grooves 18 for an upper interconnection layer and of via holes 20 in predetermined intervals.

In FIG. 5, reference numeral 10 shows a semiconductor substrate; 11, first insulating films; 12, second insulating films; 14, a lower interconnection layer material; 15, first insulating interlayers; 16, second insulating interlayers; 18, the grooves for the upper interconnection layer; 19, a resist pattern for via hole formation; and 20, the via holes.

That is, according to the second embodiment of the present invention, a plurality of grooves 13 are formed at predetermined intervals at a time in forming the groove 13 for the lower interconnection layer in the first embodiment, a plurality of grooves 18 for the upper interconnection layer are formed at predetermined intervals at a time in forming the groove 18 for the upper interconnection layer in the first embodiment and, in forming the via hole 20 in the first embodiment, a plurality of via holes 20 are formed at a time in a way to reach the lower interconnection layer 14 from the bottom levels of the respective upper interconnection layer formation grooves formed at the predetermined intervals, that is, the lower interconnection layers 14 in the grooves 13 formed at the predetermined intervals.

In this case, in the formation of the via hole 20, the opening diameter of the via hole forming resist pattern is set to a length corresponding to the width of an area of those grooves 18 plus amounts of misalignment occurring at the resist patterning for the upper interconnection layer formation grooves plus amounts of misalignment occurring at the resist patterning for the formation of the via holes plus widths of those groove-to-groove areas.

Even if overetching occurs even in the second embodiment in the case where the amounts of misalignment occurring at the resist patterning in the formation of the via holes and amounts of misalignment occurring at the resist patterning in the formation of the upper interconnection layer formation grooves are in the same direction in the same way as in the first embodiment, the second insulating films 12 serve as an etching stopper and, therefore, narrow grooves are prevented from occurring at the side areas of the lower interconnection layers 14 so that the interconnection layer stability can be improved.

Further, since the opening diameters of the via hole formation resist pattern cover the amounts of misalignment at the resist patterning in the formation of the upper interconnection layer formation grooves and amounts of misalignment at the resist patterning in the formation of the via holes, it is possible to make the respective upper interconnection layer 21 equal in size to the opening diameter of the via hole 20 so that the via hole 20 can be formed beneath the upper interconnection layer 21 in a self-aligned way.

Even in the case where, in this way, the plurality of lower interconnection layer formation grooves are formed at the predetermined intervals, any narrow grooves are prevented from being created at the side areas of the lower interconnection layer grooves so that, even if the interval of the lower interconnection layers 14 is of the order of, for example, below 1 microns, the semiconductor device can be manufactured in an effective way.

What is claimed is:

1. A method for manufacturing a semiconductor device comprising the steps of:

subsequent to sequentially forming first and second insulating films over a semiconductor substrate, forming a lower interconnection layer formation groove in the second and first insulating films by a lithography method and anisotropic etching technique;

after forming a lower interconnection layer material on a whole surface of a resultant structure, removing the lower interconnection layer material by a chemical/mechanical polishing method on the second insulating film to leave the lower interconnection layer material as a buried lower interconnection layer in the lower interconnection layer formation groove;

after sequentially forming first and second insulating interlayers on a whole surface of a resultant semiconductor structure, forming an upper interconnection layer formation groove by lithography technique and anisotropic etching technique in the second insulating interlayer;

forming a via hole in the first insulating interlayer by the lithography technique and anisotropic etching technique at an area connecting an upper interconnection layer to the lower interconnection layer, the formation of the via hole being effected by the anisotropic etching technique at an etching rate over ten times the etching rates of the second insulating film and second insulating interlayer, and wherein the via hole has an opening diameter in a resist pattern corresponding to a sum of a width of the upper interconnection layer formation groove, an amount of misalignment at a resist patterning when forming the upper interconnection layer formation groove, and an amount of misalignment at a resist patterning when forming the via hole; and removing an upper interconnection layer material by the chemical/mechanical polishing method on the second insulating interlayer in a way to leave the upper interconnection layer material, as a buried upper interconnection layer, in the upper interconnection layer formation groove and via hole.

2. A method for manufacturing a semiconductor device comprising the steps of:

subsequent to sequentially forming first and second insulating films over a semiconductor substrate, forming a plurality of lower interconnection layer formation grooves in the second and first insulating films by a lithography method and anisotropic etching technique;

after forming a lower interconnection layer material on a whole surface of a resultant structure, removing the lower interconnection layer material by a chemical/mechanical polishing method on the second insulating film to leave the lower interconnection layer material as a buried lower interconnection layer in the lower interconnection layer formation grooves;

after sequentially forming first and second insulating interlayers on a whole surface of a resultant semiconductor structure, forming a plurality of upper interconnection layer formation grooves, by lithography technique and anisotropic etching technique, in the second insulating interlayer;

forming a plurality of via holes in the first insulating interlayer by the lithography technique and anisotropic etching technique at an area connecting an upper interconnection layer to the lower interconnection layer, the formation of the via holes being effected by the anisotropic etching technique at an etching rate over ten times the etching rates of the second insulating film and second insulating interlayer, and wherein the plurality of via holes have an opening diameter in a resist pattern corresponding to a sum of widths of the upper interconnection layer formation grooves, amounts of misalignment at a resist patterning when forming the upper interconnection layer formation grooves, amounts of misalignment at a resist patterning when forming the via holes, and widths of the areas between adjacent upper interconnection layer formation grooves; and removing an upper interconnection layer material by the chemical/mechanical polishing method on the second insulating interlayer in a way to leave the upper interconnection layer material, as a buried upper interconnection layer, in the upper interconnection layer formation grooves and via holes.

* * * * *